United States Patent [19] | [11] 3,883,889
Hall | [45] May 13, 1975

[54] SILICON-OXYGEN-NITROGEN LAYERS FOR SEMICONDUCTOR DEVICES

[75] Inventor: John H. Hall, Saratoga, Calif.

[73] Assignee: Micro Power Systems, Inc., Santa Clara, Calif.

[22] Filed: Apr. 15, 1974

[21] Appl. No.: 460,736

[52] U.S. Cl. ...................... 357/73; 357/54; 106/39; 106/52; 117/215
[51] Int. Cl. ............................ H01l 5/00; H01l 3/00
[58] Field of Search ........... 357/73, 54; 106/39, 52; 117/215

[56] References Cited

UNITED STATES PATENTS 3,755,720 8/1973 Kern .................................... 357/73
3,756,876 9/1973 Brown et al. ........................ 357/54

*Primary Examiner*—Andrew J. James
*Attorney, Agent, or Firm*—Flehr, Hohbach, Test, Albritton & Herbert

[57] ABSTRACT

A protective layer for use in the manufacture of semiconductor devices and circuits and for thereafter protecting and passivating the devices comprising a combination of silicon, oxygen and nitrogen in selected atomic proportions.

5 Claims, 14 Drawing Figures

SILICON-OXYGEN-NITROGEN LAYERS FOR SEMICONDUCTOR DEVICES

BACKGROUND OF THE INVENTION

This invention relates generally to masking, passivating and insulating films or layers for semiconductor devices and circuits and more particularly to silicon oxynitride films or layers.

Masking layers are generally applied to the surface of semiconductor wafers and selectively removed during the processing of the wafer to form devices, to thereafter support the interconnect metal layers and to protect and passivate the devices. Silicon dioxide has been extensively used for this purpose. The oxide layer serves to mask and insulate and passivate junctions which extend to the surface. More recently, silicon dioxide insulating layers have been used in metal-oxide silicon (MOS) structures for masking, insulating and junction protection.

Silicon dioxide layers have several drawbacks. Grown or deposited silicon dioxide layers on a silicon substrate are generally under compressive stresses giving rise to high recombination currents at the surface thereby increasing leakage across the junction. Silicon oxide does not effectively mask against alkaline metal atoms, such as sodium atoms. Consequently, they diffuse through the layer and introduce instabilities where the PN junction intersects the surface of the device.

It has been suggested that layers of silicon nitride can be used for protection against migration of impurities which deleteriously affect the operation of the devices. However, such protective layers introduce large tensile stresses giving rise to high recombination currents at the surface with silicon dioxide. It has been suggested that the protective or insulating film can be a composition of silicon, oxygen and nitrogen.

OBJECTS AND SUMMARY OF INVENTION

It is a general object of the present invention to provide an improved masking, insulating, protective and passivating layer comprising a selected combination of silicon, oxygen and nitrogen, for semiconductor devices.

It is another object of the present invention to provide silicon oxynitride protective films that can be grown and processed using processes similar to those used for silicon dioxide whereby devices such as bipolar, MOS, MOS/LSI, integrated circuits and the like can be fabricated using substantially conventional techniques for the masking, etching, diffusion, metallizing and other processing steps.

The foregoing objects are achieved by providing a protective layer comprising silicon oxynitride ($Si_x O_y N_z$) where $x$, $y$ and $z$ are atomic percentages respectively for Si, O, and N, and are selected to provide a protective layer which minimizes stress between the device body and the layer and which inhibits the diffusion of impurity atoms through the layer, particularly alkaline metal atoms, such as sodium. More particularly, the device includes a silicon oxynitride film in which $x$ is between 30 and 40%; $y$ between 45 and 55%; and $z$ between 10 and 20%.

DESCRIPTION OF PREFERRED EMBODIMENT

Figure 2:
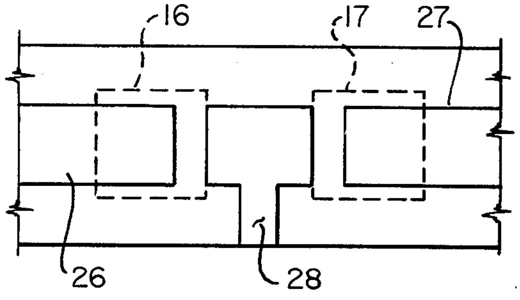
FIG. 2 is a plan view of the device of FIG. 1G showing the metal interconnections overlying the silicon oxynitride protective layer and selectively contacting the silicon substrate surface.

The use of the improved layer for masking, protecting and passivating silicon semiconductor is first described in connection with the manufacture of a metal-oxide-silicon field effect transistor (MOSFET). Referring to FIGS. 1A–1G, a silicon substrate 11 of n-type or p-type conductivity and with selected impurity concentration, FIG. 1A, is treated to form thereon an insulating masking layer 12 of silicon-oxygen-nitrogen ($Si_x O_y N_z$). The layer 12 may be formed by introducing a silane gas, nitrogen hydride gas and oxygen ($Si H_4 + NH_3 + O_2$) into a chamber or oven held at an elevated temperature of 750°C – 1100°C in which the substrate is placed. The gases interact and deposit $Si_x O_y N_z$ layer 12 on the surface by vapor deposition, FIG. 1B. By introducing a selected volume ratio of silane, nitrogen hydride and oxygen, it is possible to deposit a layer having selected atomic ratio. In accordance with the invention, the atomic ratio is selected so that the layer is adherent to the surface of the substrate, so that it has substantially the same coefficient of expansion as the substrate, so that it passivates the PN junction extending to the surface so that it masks against the migration of alkaline earth metal atoms and so that it can be etched. By masking and etching using conventional masking techniques and etching with conventional buffered etching solutions such as a buffered HF solution, portions of the layer 12 are removed to form spaced windows 13 and 14, FIG. 1C. Thereafter, regions 16 and 17, of opposite conductivity type, are formed by diffusion or ion implantation, FIG. 1D. A new $Si_x O_y N_z$ layer 18 is grown to cover the surface, FIG. 1E. The layer may be formed by vapor deposition during the diffusion process. The wafer is then again masked and etched to form windows 21 and 22. A metal layer 23 is then provided on the surface and extending into the windows to contact the underlying regions 16 and 17, FIG. 1F. The layer is then selectively etched to form source contact 26, drain contact 27 and gate contact 28, FIGS. 1G and 2.

In accordance with the invention, the composition of the silicon-oxygen-nitrogen ($Si_x O_y N_z$) masking layer 12 in which $x$, $y$ and $z$ are the atomic percentages respectively for silicon, oxygen and nitrogen is as follows:

$$x = 30\% - 40\%$$

$$y = 45\% - 55\%$$

$$z = 10\% - 20\%$$

Layers having the foregoing atomic percentages have been found to be readily etched by standard etches such as buffered HF, have been found to be impervious to the migration of sodium, have minimum stress with the underlying silicon, have a minimum of recombination currents at the junction thereby passivating the junction and serve to suitably support metal layers forming the interconnections for the devices formed in a wafer. It is further noted that the above processes are readily adaptable to the conventional processing steps such as those used in connection with silicon dioxide masking and etching conventionally used in the manufacture of transistors, bipolar devices, MOS devices, integrated circuits and the like.

Figure 3:
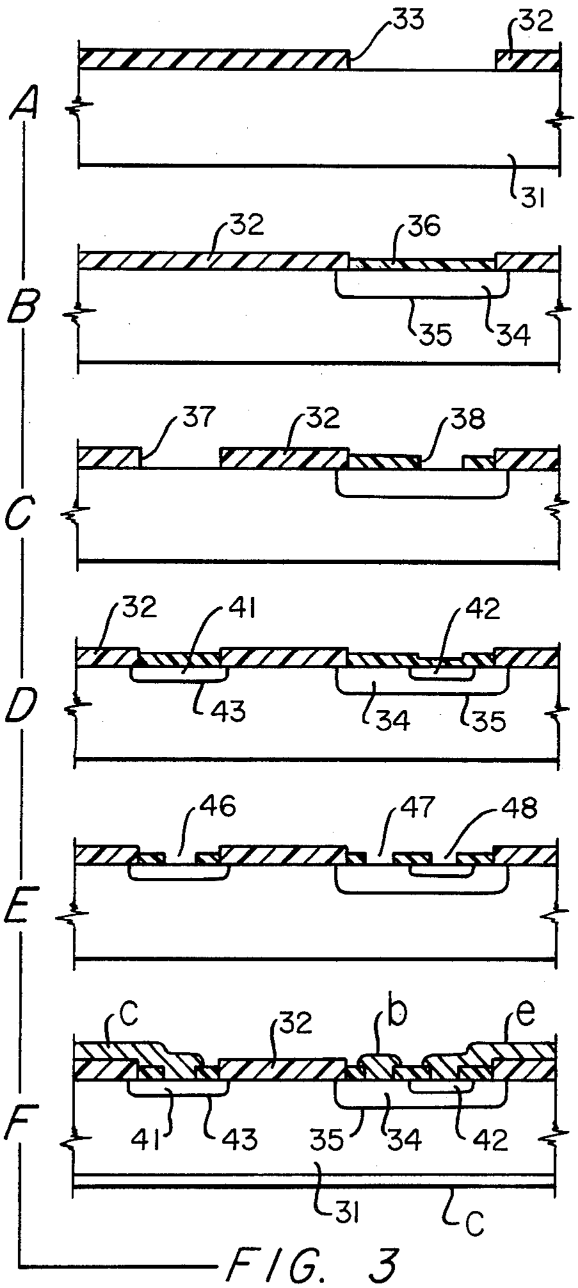
FIGS. 3A–3F show the steps in manufacturing an integrated bipolar device in accordance with the invention.

Another example of use of the improved masking, protecting and passivating layer in accordance with the invention is shown in FIGS. 3A–3F wherein the insulating layer in accordance with the invention is illustrated for the formation of a bipolar transistor. More particularly, a silicon substrate 31 of n-type conductivity with selected impurity concentration is processed as described above to form thereon a silicon-oxygen-nitrogen insulating layer 32 in accordance with the present invention which is masked and etched by conventional techniques to form window 33. The layer 32 may be formed as described above, that is, by chemical vapor deposition. An impurity of opposite conductivity type is then deposited on the exposed surface of the silicon at the window 33 and thereafter the layer is diffused into the silicon body to form a region 34 which forms junction 35 with the wafer 31. The junction 35 extends to the surface beneath the surface layer 33. The diffusion is carried out in a suitable atmosphere whereby to redeposit a silicon-oxygen-nitrogen layer 36 on the surface, FIG. 3B. The device of FIG. 3B is then suitably masked and etched to form spaced windows 37 and 38, FIG. 3C.

The device is then deposited with an impurity of the same conductivity type and suitably diffused to form spaced diffused regions 41 and 42, FIG. 3D. It is to be noted that the ends of the junctions 43 and 35 extend to the surface beneath the layer 32. Thereafter, spaced windows 46, 47 and 48 are opened to provide means for making ohmic contact with the various layers, FIG. 3E. A metal layer is applied to the surface by evaporation or sputtering to extend into the windows to contact the exposed regions. The metal layer is thereafter etched to form the collector, base and emitter contacts. The buried region 41 forms a good ohmic connection with the collector region, while the metal layers contact the emitter and base directly; the contacts to the emitter, base and collectors are identified by the letters *e*, *b* and *c*, FIG. 3F.

Figure 1:
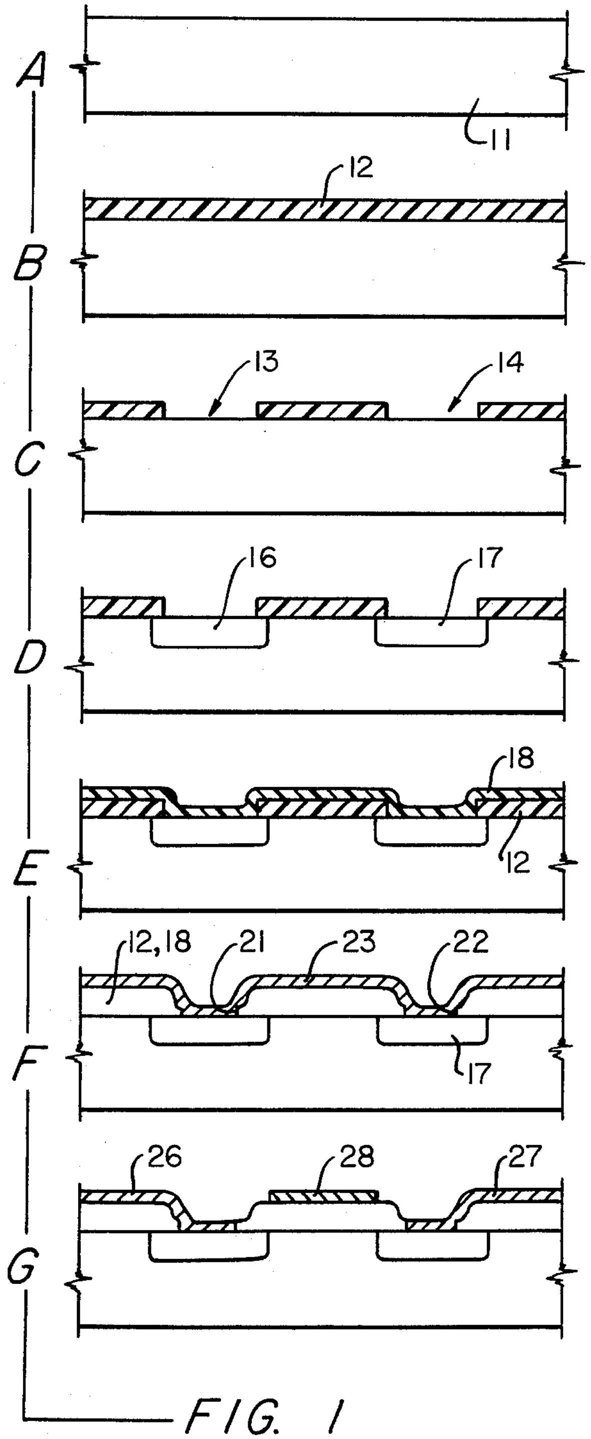
FIGS. 1A–1G show the steps of manufacturing a metal-oxide-silicon (MOS) device in accordance with the invention.

Thus, it is seen that the process lends itself to the formation of bipolar as well as unipolar devices such as the device shown in FIG. 1 and is readily adaptable to all types of integrated circuit applications.

In all instances, the junctions are protected and passivated by the silicon-oxygen-nitrogen ($Si_x O_y N_z$) layer which has minimum recombination currents at the junction which suitably masks against sodium ion migration in that it is substantially impervious to the sodium ion migration. The protective layer further reduces stresses in that it has substantially the same coefficient of expansion as the underlying silicon layer. During the processing of the device, the layer suitably serves as a mask which is readily processed by conventional techniques.

I claim:

1. In a semiconductor device of the type which includes a substrate of semiconductor material of one conductivity type and a region of opposite conductivity type extending therein and to form a junction therewith which extends to one surface of the device, a protective layer carried on said one surface of the device and extending over said junction to passivate and protect the junction, said layer comprising a composition of silicon, oxygen and nitrogen ($Si_x O_y N_z$) in which $$x = 30\% \text{ to } 40\%$$
$$y = 45\% \text{ to } 55\%$$
$$z = 10\% \text{ to } 20\%$$

where $z$, $y$ and $z$ are the atomic percentages for silicon, oxygen and nitrogen respectively.

2. A semiconductor device as in claim 1 wherein the substrate is silicon.

3. A semiconductor device as in claim 2 wherein said protective insulating layer includes a window over said region of opposite conductivity type and a metal layer overlies a portion of said layer and extends into said window to form ohmic contact with said region.

4. A semiconductor device including a silicon substrate of one conductivity type, spaced regions of opposite conductivity type extending into said substrate and forming junctions therewith, a protective and insulating layer formed on one surface of said device and extending over said junctions, said layer comprising a composition of silicon, oxygen and nitrogen ($Si_x O_y N_z$) in which $$x = 30\% \text{ to } 40\%$$
$$y = 45\% \text{ to } 55\%$$
$$z = 10\% \text{ to } 20\%$$

where $x$, $y$ and $z$ are the atomic percentages for silicon, oxygen and nitrogen respectively, spaced openings formed in said layer over said regions, metal layers extending over said insulating layer and extending to said regions to make ohmic contact therewith, and an additional metal layer over the portion of the insulating layer between said regions, said metal layers forming source and drain contacts and said additional metal layer forming the gate contact of a metal oxide silicon field effect transistor.

5. A semiconductor device including a silicon substrate of one conductivity type, a region of opposite conductivity type extending into said substrate to form a junction therewith, spaced regions of the same conductivity type extending into said substrate, one of said regions extending into said region of opposite conductivity type to form a junction therewith, a protective insulating layer carried on said one surface extending over said junction to passivate and protect the junction, said layer comprising a composition of silicon, oxygen and nitrogen ($Si_x O_y N_z$) in which $$x = 30\% \text{ to } 40\%$$
$$y = 45\% \text{ to } 55\%$$
$$z = 10\% \text{ to } 20\%$$

where $x$, $y$ and $z$ are the atomic percentages for silicon, oxygen and nitrogen respectively, openings formed in said layer to expose said region of opposite conductivity type and said spaced regions of the same conductivity type, a metal layer having individual portions extending into said openings to contact said regions and carried by the insulating layer, said individual portions defining emitter, base and collector contacts.

* * * * *